United States Patent
Bouazizi et al.

(10) Patent No.: US 10,079,868 B2
(45) Date of Patent: Sep. 18, 2018

(54) METHOD AND APPARATUS FOR FLEXIBLE BROADCAST SERVICE OVER MBMS

(71) Applicant: Samsung Electronics Co., Ltd., Suwon-si, Gyeonggi-do (KR)

(72) Inventors: Imed Bouazizi, Mountain View, CA (US); Kyungmo Stanley Park, Mountain View, CA (US)

(73) Assignee: Samsung Electronics Co., Ltd., Suwon-Si (KR)

(*) Notice: Subject to any disclaimer, the term of this patent is extended or adjusted under 35 U.S.C. 154(b) by 121 days.

(21) Appl. No.: 15/093,439

(22) Filed: Apr. 7, 2016

(65) Prior Publication Data

US 2016/0301725 A1    Oct. 13, 2016

Related U.S. Application Data

(60) Provisional application No. 62/144,020, filed on Apr. 7, 2015, provisional application No. 62/280,450, filed on Jan. 19, 2016.

(51) Int. Cl.
| | |
|---|---|
| *G06F 15/16* | (2006.01) |
| *H04L 29/06* | (2006.01) |
| *H03M 13/00* | (2006.01) |
| *H04L 12/18* | (2006.01) |
| *H04N 21/241* | (2011.01) |
| *H04N 21/643* | (2011.01) |
| *H04N 21/858* | (2011.01) |

(Continued)

(52) U.S. Cl.
CPC .... *H04L 65/4076* (2013.01); *H03M 13/6525* (2013.01); *H04L 12/189* (2013.01); *H04L 12/1813* (2013.01); *H04L 65/403* (2013.01); *H04L 67/02* (2013.01); *H04N 21/241* (2013.01); *H04N 21/643* (2013.01); *H04N 21/8586* (2013.01); *H04W 4/06* (2013.01)

(58) Field of Classification Search
CPC ............... H04L 65/4076; H04L 65/403; H04L 12/1813; H04L 67/02
USPC ........................................................ 709/219
See application file for complete search history.

(56) References Cited

U.S. PATENT DOCUMENTS 9,544,097 B1 * 1/2017 Vivanco ..................... H04L 1/08
9,674,251 B2 * 6/2017 Wang ....................... H04L 65/60
(Continued)

FOREIGN PATENT DOCUMENTS

| JP | 2005-348392 | 12/2005 |
|---|---|---|
| WO | WO 2013/155104 A1 | 10/2013 |

OTHER PUBLICATIONS

International Search Report dated Jul. 8, 2016 in connection with International Application No. PCT/KR2016/003649, 17 pages.
Written Opinion of the International Searching Authority dated Jul. 8, 2016 in connection with International Application No. PCT/KR2016/003649, 6 pages.

(Continued)

*Primary Examiner* — Kristie Shingles (57) ABSTRACT

A method and an apparatus for flexible broadcast service over multimedia broadcast multicast service (MBMS). The method includes transmitting a request for a location of content to a server. The method also includes when a MBMS is available for the content, receiving a MBMS delivery description for the location of the content, and joining session for the MBMS that carries the content based on the MBMS delivery description. The method further includes receiving a non-MBMS uniform resource locator (URL) for the content when the MBMS is not available for the content.

17 Claims, 6 Drawing Sheets

(51) Int. Cl.
*H04W 4/06* (2009.01)
*H04L 29/08* (2006.01)

(56) References Cited

U.S. PATENT DOCUMENTS

| | | | | |
|---|---|---|---|---|
| 2005/0172016 | A1* | 8/2005 | Kossi | H04L 63/0428 709/223 |
| 2005/0207415 | A1 | 9/2005 | Curcio et al. | |
| 2005/0281270 | A1* | 12/2005 | Kossi | H04L 12/2854 370/395.5 |
| 2008/0267152 | A1* | 10/2008 | Alnas | H04L 29/12066 370/338 |
| 2014/0095668 | A1 | 4/2014 | Oyman | |
| 2014/0301202 | A1* | 10/2014 | Bouazizi | H04W 4/06 370/235 |
| 2014/0372624 | A1* | 12/2014 | Wang | H04L 65/60 709/231 |
| 2015/0029925 | A1 | 1/2015 | Mantin | |

OTHER PUBLICATIONS

3rd Generation Partnership Project; Technical Specification Group Services and System Aspects; Multimedia Broadcast/Multicast Service (MBMS); Protocols and Codecs (Release 13); 3GPP TS 26.346; V13.0.0; Mar. 2015; 207 pages.

Communication from a foreign patent office in a counterpart foreign application, European Patent Office, "Supplementary European Search Report," European Application No. EP16776877.9, dated Mar. 27, 2018, 10 pages.

3GPP TR 26.848 V12.0.0 (Dec. 2014), Technical Specification, 3rd Generation Partnership Project; Technical Specification Group Services and System Aspects; Multimedia Broadcast/Multicast Service (MBMS); Enhanced MBM operation (Release 12), 61 pages.

3GPP TS 26.346 V11.2.0 (Sep. 2012), Technical Specification, 3rd Generation Partnership Project; Technical Specification Group Services and System Aspects; Multimedia Broadcast/Multicast Service (MBMS); Protocols and codecs (Release 11), 158 pages.

\* cited by examiner

METHOD AND APPARATUS FOR FLEXIBLE BROADCAST SERVICE OVER MBMS

CROSS-REFERENCE TO RELATED APPLICATION(S) AND CLAIM OF PRIORITY

This application claims priority under 35 U.S.C. § 119(e) to U.S. Provisional Patent Application No. 62/144,020, titled "METHOD AND APPARATUS FOR FLEXIBLE BROADCAST SERVICES OVER MBMS" filed on Apr. 7, 2015, and also claims priority under 35 U.S.C. § 119(e) to U.S. Provisional Patent Application No. 62/280,450, titled "METHOD AND APPARATUS FOR A TRANSMISSION FRAMEWORK OVER MBMS" filed on Jan. 19, 2016. The above-identified provisional patent application is hereby incorporated by reference in its entirety.

TECHNICAL FIELD

This disclosure relates generally to multi-media broadcast/multicast services (MBMS). More specifically, this disclosure relates to a method and apparatus for flexible broadcast service over MBMS.

BACKGROUND

The MBMS specification is built around two delivery methods, download and streaming, which are used to build user services. A user service consists of one or more delivery methods, auxiliary delivery procedures, such as file repair and reception reporting, and a user service description to enable selection and access to the service. Over the past years, MBMS has proven to be most relevant for streaming of live events over a limited MBMS broadcast area and distribution of high popularity files such as firmware updates.

SUMMARY

Embodiments of the present disclosure provide a method and apparatus for flexible broadcast service over MBMS.

In one embodiment, a client device for flexible broadcast service over MBMS is provided. The method includes a memory; and one or more processors operably coupled to the memory. The one or more processors are configured to transmit a request for a location of content to a server. The one or more processors are also configured when a multimedia broadcast multicast service (MBMS) is available for the content, receive a MBMS delivery description for the location of the content, and join session for the MBMS that carries the content based on the MBMS delivery description. The one or more processors are further configured to receive a non-MBMS uniform resource locator (URL) for the content when a MBMS is not available for the content.

In another embodiment, a method for flexible broadcast service over MBMS is provided. The method includes transmitting a request for a location of content to a server. The method also includes when a multimedia broadcast multicast service (MBMS) is available for the content, receiving a MBMS delivery description for the location of the content, and joining session for the MBMS that carries the content based on the MBMS delivery description. The method further includes receiving a non-MBMS uniform resource locator (URL) for the content when a MBMS is not available for the content.

In another embodiment, a server for flexible broadcast service over MBMS is provided. The server includes a memory and one or more processors operably coupled to the memory. The one or more processors configured to receive a request for a location of content from a client device. The one or more processors are also configured to determine whether a multimedia broadcast multicast service (MBMS) is available for the content. The one or more processors are further configured to transmit a MBMS delivery description for the location of the content to enable the client device to join session for the MBMS that carries the content in response to a high demand for the content and transmit an indication that the content is unavailable over MBMS in response to low demand for the content.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

An intuitive method of delivering the same content to a large group of users is to utilize a broadcasting mechanism instead of allocating dedicated network resources for every single user. Delivery of TV channels and push of large software updates over the air are examples of such services that benefit greatly from broadcast.

LTE defined the multimedia broadcast multicast service (MBMS) to address the needs of these services in the most cost-efficient way. It initially defined two different modes: broadcast and multicast. The multicast mode was however dropped as the savings were eliminated by the usage of tunneling of the user space multicast traffic.

Figure 1:
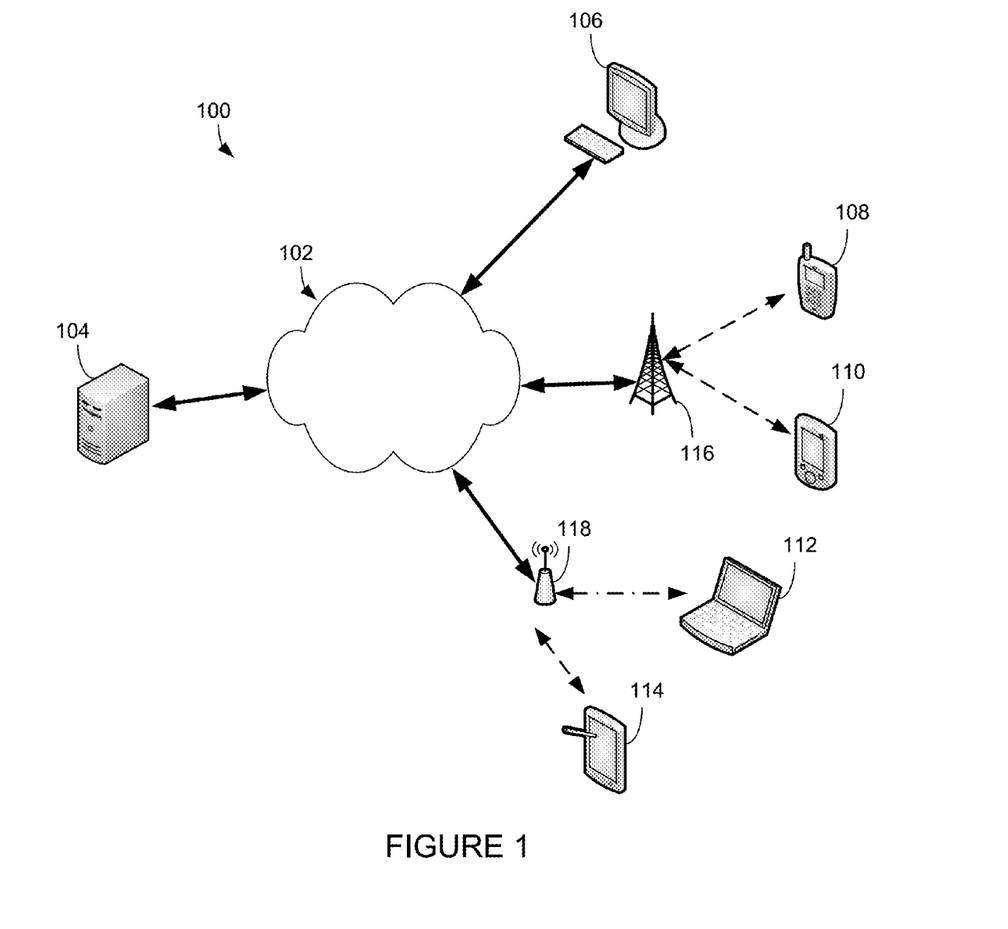
FIG. 1 illustrates an example computing system according to various embodiments of the present disclosure.

FIG. 1 illustrates an example computing system 100 according to this disclosure. The embodiment of the computing system 100 shown in FIG. 1 is for illustration only. Other embodiments of the computing system 100 could be used without departing from the scope of this disclosure.

As shown in FIG. 1, the system 100 includes a network 102, which facilitates communication between various components in the system 100. For example, the network 102 may communicate internet protocol (IP) packets, frame relay frames, asynchronous transfer mode (ATM) cells, or other information between network addresses. The network 102 may include one or more local area networks (LANs), metropolitan area networks (MANs), wide area networks (WANs), all or a portion of a global network such as the Internet, or any other communication system or systems at one or more locations.

The network 102 facilitates communications between at least one server 104 and various client devices 106-114. Each server 104 includes any suitable computing or processing device that can provide computing services for one or more client devices. Each server 104 could, for example, include one or more processing devices, one or more memories storing instructions and data, and one or more network interfaces facilitating communication over the network 102.

Each client device 106-114 represents any suitable computing or processing device that interacts with at least one server or other computing device(s) over the network 102. In this example, the client devices 106-114 include a desktop computer 106, a mobile telephone or smartphone 108, a personal digital assistant (PDA) 110, a laptop computer 112, and a tablet computer 114. However, any other or additional client devices could be used in the computing system 100.

In this example, some client devices 108-114 communicate indirectly with the network 102. For example, the client devices 108-110 communicate via one or more base stations 116, such as cellular base stations or eNodeBs. Also, the client devices 112-114 communicate via one or more wireless access points 118, such as IEEE 802.11 wireless access points. Note that these are for illustration only and that each client device could communicate directly with the network 102 or indirectly with the network 102 via any suitable intermediate device(s) or network(s).

Although FIG. 1 illustrates one example of a computing system 100, various changes may be made to FIG. 1. For example, the system 100 could include any number of each component in any suitable arrangement. In general, computing and communication systems come in a wide variety of configurations, and FIG. 1 does not limit the scope of this disclosure to any particular configuration. While FIG. 1 illustrates one operational environment in which various features disclosed in this patent document can be used, these features could be used in any other suitable system.

Figure 2:
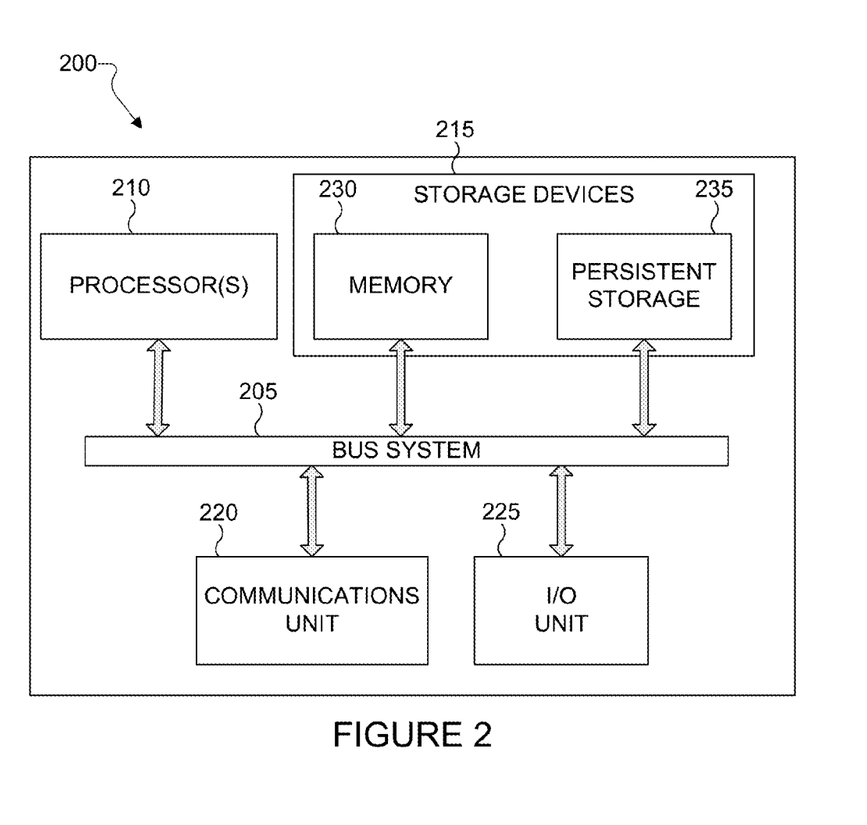
FIGS. 2 and 3 illustrate example devices in a computing system according to the various embodiments of the present disclosure.
Figure 3:
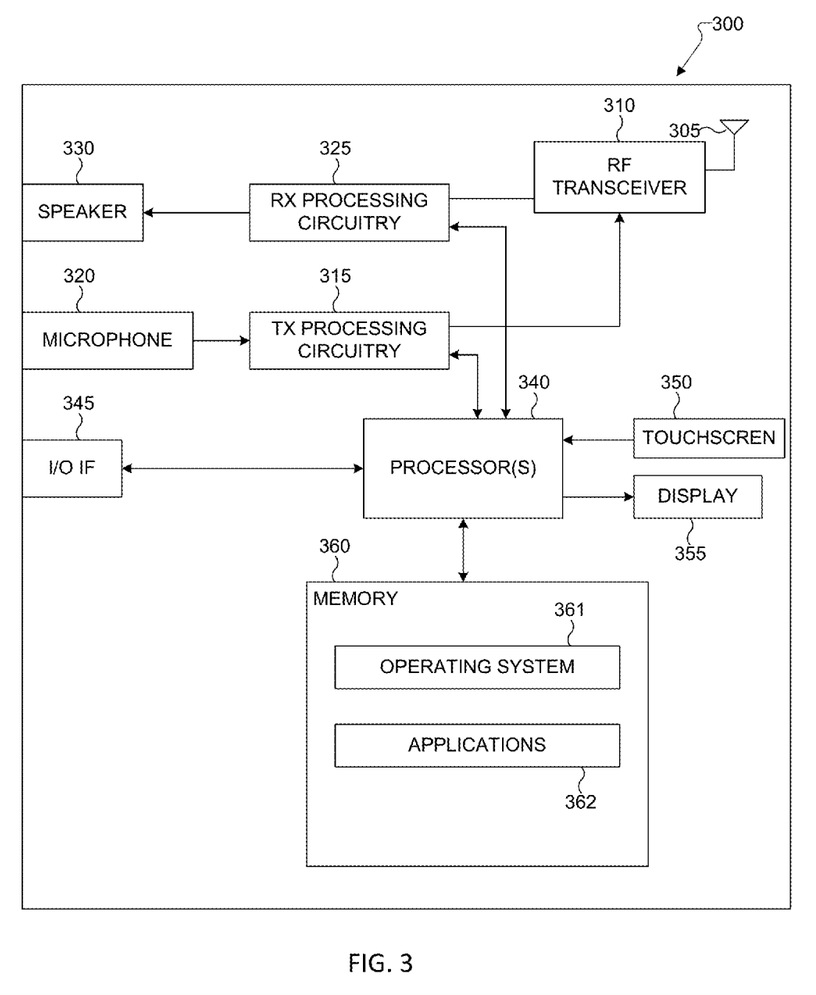

FIGS. 2 and 3 illustrate example devices in a computing system according to this disclosure. In particular, FIG. 2 illustrates an example server 200, and FIG. 3 illustrates an example client device 300. The server 200 could represent the server 104 in FIG. 1, and the client device 300 could represent one or more of the client devices 106-114 in FIG. 1.

As shown in FIG. 2, the server 200 includes a bus system 205, which supports communication between at least one processing device 210, at least one storage device 215, at least one communications unit 220, and at least one input/output (I/O) unit 225.

The processing device 210 executes instructions that may be loaded into a memory 230. The processing device 210 may include any suitable number(s) and type(s) of processors or other devices in any suitable arrangement. Example types of processing devices 210 include microprocessors, microcontrollers, digital signal processors, field programmable gate arrays, application specific integrated circuits, and discreet circuitry. The processing device 210 is configured to perform operations for unlocking an electronic device with an authenticated wearable device.

The memory 230 and a persistent storage 235 are examples of storage devices 215, which represent any structure(s) capable of storing and facilitating retrieval of information (such as data, program code, and/or other suitable information on a temporary or permanent basis). The memory 230 may represent a random access memory or any other suitable volatile or non-volatile storage device(s). The persistent storage 235 may contain one or more components or devices supporting longer-term storage of data, such as a ready only memory, hard drive, flash memory, or optical disc.

The communications unit 220 supports communications with other systems or devices. For example, the communications unit 220 could include a network interface card or a wireless transceiver facilitating communications over the network 102. The communications unit 220 may support communications through any suitable physical or wireless communication link(s).

The I/O unit 225 allows for input and output of data. For example, the I/O unit 225 may provide a connection for user input through a keyboard, mouse, keypad, touchscreen, or other suitable input device. The I/O unit 225 may also send output to a display, printer, or other suitable output device.

Note that while FIG. 2 is described as representing the server 104 of FIG. 1, the same or similar structure could be used in one or more of the client devices 106-114. For example, a laptop or desktop computer could have the same or similar structure as that shown in FIG. 2.

As shown in FIG. 3, the client device 300 includes an antenna 305, a radio frequency (RF) transceiver 310, transmit (TX) processing circuitry 315, a microphone 320, and receive (RX) processing circuitry 325. The client device 300 also includes a speaker 330, a main processor 340, an input/output (I/O) interface (IF) 345, a keypad 350, a display 355, and a memory 360. The memory 360 includes a basic operating system (OS) program 361 and one or more applications 362.

The RF transceiver 310 receives, from the antenna 305, an incoming RF signal transmitted by another component in a system. The RF transceiver 310 down-converts the incoming RF signal to generate an intermediate frequency (IF) or baseband signal. The IF or baseband signal is sent to the RX processing circuitry 325, which generates a processed baseband signal by filtering, decoding, and/or digitizing the baseband or IF signal. The RX processing circuitry 325 transmits the processed baseband signal to the speaker 330 (such as for voice data) or to the main processor 340 for further processing (such as for web browsing data).

The TX processing circuitry 315 receives analog or digital voice data from the microphone 320 or other outgoing baseband data (such as web data, e-mail, or interactive video game data) from the main processor 340. The TX processing circuitry 315 encodes, multiplexes, and/or digitizes the outgoing baseband data to generate a processed baseband or IF signal. The RF transceiver 310 receives the outgoing processed baseband or IF signal from the TX processing circuitry 315 and up-converts the baseband or IF signal to an RF signal that is transmitted via the antenna 305.

The main processor 340 can include one or more processors or other processing devices and execute the basic OS program 361 stored in the memory 360 in order to control the overall operation of the client device 300. For example, the main processor 340 could control the reception of forward channel signals and the transmission of reverse channel signals by the RF transceiver 310, the RX processing circuitry 325, and the TX processing circuitry 315 in accordance with well-known principles. In some embodiments, the main processor 340 includes at least one microprocessor or microcontroller.

The main processor 340 is also capable of executing other processes and programs resident in the memory 360, such as operations for flexible broadcast service over MBMS. The main processor 340 can move data into or out of the memory 360 as required by an executing process. In some embodiments, the main processor 340 is configured to execute the applications 362 based on the OS program 361 or in response to signals received from external devices or an operator. The main processor 340 is also coupled to the I/O interface 345, which provides the client device 300 with the ability to connect to other devices such as laptop computers and handheld computers. The I/O interface 345 is the communication path between these accessories and the main controller 340.

The main processor 340 is also coupled to the keypad 350 and the display unit 355. The operator of the client device 300 can use the keypad 350 to enter data into the client device 300. The display 355 may be a liquid crystal display or other display capable of rendering text and/or at least limited graphics, such as from web sites.

The memory 360 is coupled to the main processor 340. Part of the memory 360 could include a random access memory (RAM), and another part of the memory 360 could include a flash memory or other read-only memory (ROM).

Although FIGS. 2 and 3 illustrate examples of devices in a computing system, various changes may be made to FIGS. 2 and 3. For example, various components in FIGS. 2 and 3 could be combined, further subdivided, or omitted and additional components could be added according to particular needs. As a particular example, the main processor 340 could be divided into multiple processors, such as one or more central processing units (CPUs) and one or more graphics processing units (GPUs). Also, while FIG. 3 illustrates the client device 300 configured as a mobile telephone or smartphone, client devices could be configured to operate as other types of mobile or stationary devices. In addition, as with computing and communication networks, client devices and servers can come in a wide variety of configurations, and FIGS. 2 and 3 do not limit this disclosure to any particular client device or server.

Figure 4:
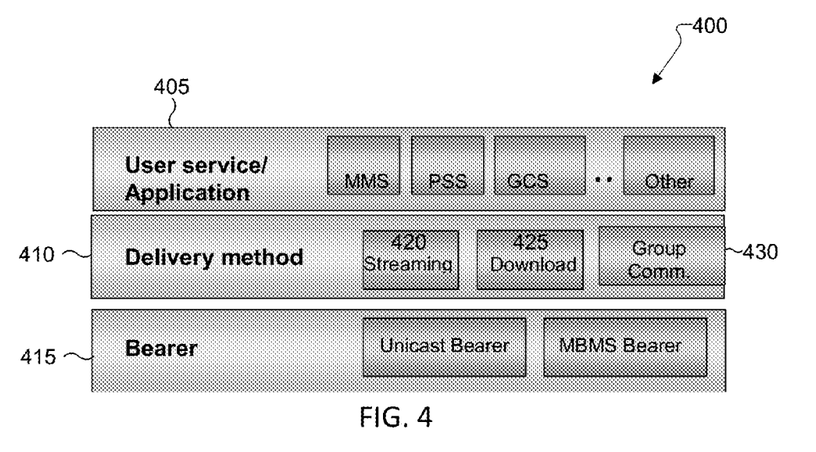
FIG. 4 illustrates an example reference model for the relationships between the user services, the delivery methods, and the bearer services according to the various embodiments of the present disclosure.
Figure 5:
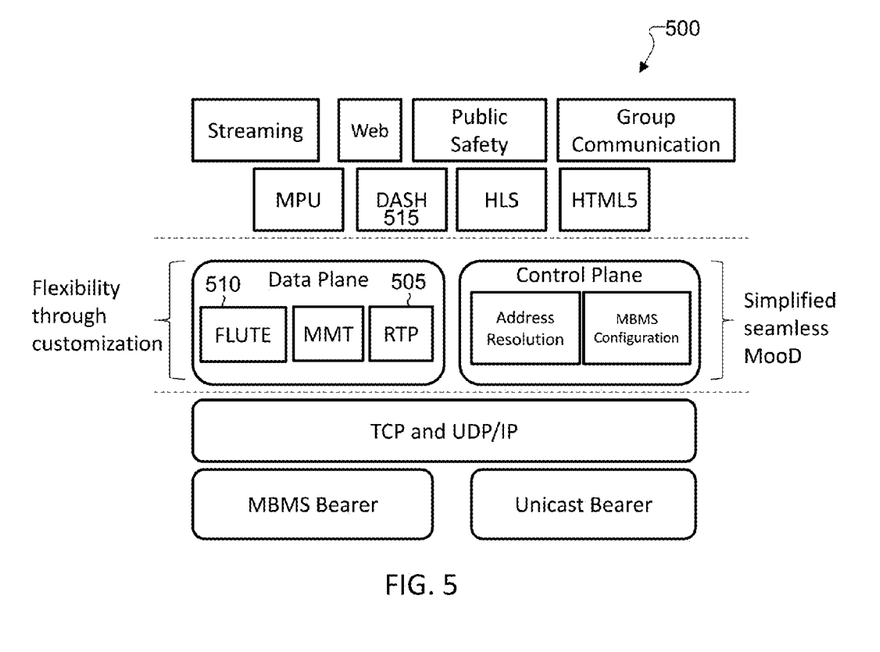
FIG. 5 illustrates an example protocol stack according to the various embodiments of the present disclosure.

FIG. 4 illustrates an example reference model 400 for the relationships between the user services 405, the delivery methods 410, and the bearer services 415. FIG. 5 illustrates an example protocol stack 500 according to the various embodiments of the present disclosure. The embodiment of the reference model 400 illustrated in FIG. 4 and the protocol stack 500 in FIG. 5 are for illustration only. FIGS. 4 and 5 do not limit the scope of this disclosure to any particular implementation of an electronic device.

MBMS for LTE (eMBMS) relies on broadcasting support on the air interface, usage of IP multicast for the transport of IP packets between the gateway and the base stations, and specific procedures for establishing and maintaining MBMS sessions. The key components of the MBMS solutions are the MBMS user services 405 and the MBMS bearer services 415. An MBMS bearer service 415 is a point-to-multi-pointing content distribution channel that provides a set of specific functionality in the mobile network and the user equipments (UEs). The key network element in MBMS architecture is the broadcast multicast—service center (BM-SC) which establishes MBMS user services, created MBMS user bearers and performs the media delivery over MBMS as well as the other functions (security, service announcement, associated delivery procedures, . . . )

An MBMS user service 405 is an instantiation of a set of tools to deliver content to the UEs. It consists of one or more delivery methods, a service description and a service announcement procedure, associated delivery procedures, security and reporting tools.

Currently, there are three different delivery methods 410 that are defined streaming 420, download 425, and group communication 430. Streaming 420 was designed as part of MBMS Release 6 to cater for mobile TV services. Streaming 420 relies on the RTP/RTCP protocol 505 for media data delivery and defines a FEC framework that supports protection of multiple media streams together. The download 425 delivery method provides the functionality of reliably delivering files to the UEs. The UEs uses the file delivery over unidirectional transport (FLUTE) protocol 510 with its FEC building block as well as file repair over HTTP to enhance the reliability of the service. With the emergence of media streaming over HTTP, the value of the streaming 420 delivery method has diminished significantly due to the high complexity of maintaining a streaming server that uses RTP/RTCP 505. Instead, the download 425 delivery method has been enhanced slightly to support the delivery of HTTP streaming content over FLUTE 510.

The third and most recent addition to the delivery methods of MBMS is the group communication (GC) 430 delivery method. The GC 430 delivery method has been added to address the needs of public safety services and other services that require higher flexibility that the one offered by the other two methods. For instance, services may wish to use different protocols, formats, and service announcement procedures than the ones that are defined by the download 425 and the streaming 420 delivery methods. As an example, a streaming 420 service provider might wish to deliver HLS formatted media data over the FCAST protocol. In this case, the download 425 delivery method cannot be used as it does neither support the format nor the protocol. Another example is the public safety service s that wishes to send encrypted speech data over a very low delay channel. The streaming method is not suitable for this case as the BM-SC would have to do the encryption on behalf of the service provider and the delays that e.g. the FEC framework enforces would not be acceptable to the service provider.

The file download profile is designed to be used for delivery of files using an offline-type delivery mode. Files are usually pushed by the broadcast multicast service center (BM-SC) at scheduled times and cached locally for later consumption by the applications on the user equipment (UE). The file download profile is identified by the following URI: "urn:3gpp:mbms:download:2015". The uniform resource identifier (URI) is provided as part of the multimedia broadcast multicast services (MBMS) metadata envelope that carries the MBMS user service description metadata fragment.

The usage of the download session announcement shall be delivered in one of the following ways:

1. Over the air (OTA)—hypertext transfer protocol (HTTP) push bearer shall only carry the metadata envelope that contains a single metadata item, which contains the MBMS USD metadata fragment. The UE that is interested in the user service shall request all referenced fragments using HTTP.

2. Pre-configured MBMS user service that triggers the setup of MBMS bearer services on need basis and over a pre-configured service area.

3. MBMS is activated on-demand as a response to a request for popular content that the operator then decides to serve over MBMS.

The user service description (USD) shall contain the following metadata fragments:

1. A user service description metadata fragment that shall contain exactly one delivery method, which shall contain exactly one associatedProcedureDescriptionURI.

2. The associatedProcedureDescription fragment shall contain one postFileRepair element that supports byte-range repairs.

3. No protectionDescription for transport-level security shall be provided and content should be protected using a content protection solution such as open mobile alliance (OMA)—digital rights media (DRM).

4. A schedule fragment may be provided to indicate the transmission time(s) for each resource. The schedule fragment shall be present for an MBMS service that is announced over OTA-PUSH.

Figure 6:
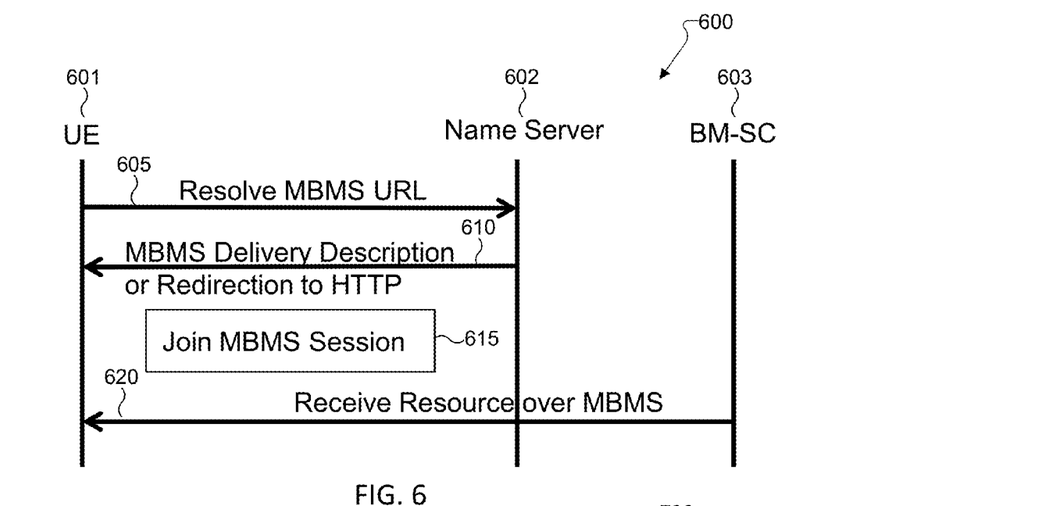
FIG. 6 illustrates an example flow diagram for resolving an MBMS URL according to the various embodiments of the present disclosure.

The delivery function uses FLUTE 610 as the transport protocol. There should be only one FLUTE session.

In addition, the delivery of the session content over unicast is not supported in this profile. The keep updated service should be supported.

A UE compatible with this profile should support MBMS on demand. The reception of a file over unicast may be redirected to MBMS for reception of the requested resource. The UE shall account for possible delays in the delivery.

Dynamic adaptive streaming over HTTP (DASH) Profile 515

The DASH Profile 515 is a profile specifically defined for DASH content delivery over hybrid unicast/broadcast channels. The DASH presentation consists of a set of representations, some of which are delivered over broadcast (usually a main audio and video representation) and other complementary or alternative representations delivered over unicast. The DASH profile is identified by the URI: "urn:3gpp:mbms:dash:2015".

The service announcement for DASH over MBMS shall be delivered in one of the following ways: a dedicated pre-configured MBMS channel that carries MBMS metadata envelopes. The media presentation description (MPD) and the session description protocol (SDP) files that describe the locations of the actual MBMS user service shall be delivered over the same announcement channel. Other metadata fragments may be delivered over the broadcast channel that carries the DASH content or it may be fetched over unicast.

The service announcement shall contain the following metadata fragments:

USD metadata fragment, which contains at least one deliveryMethod. No associatedDeliveryProcedureURI or protectionDescriptionURI shall be present. It shall contain a single appService element that references the MPD in the appServiceDescriptionURI. The initiation segments shall be distributed over the broadcast channel that carries the corresponding representation.

The delivery function uses FLUTE 610 as the transport protocol. Multiple FLUTE sessions may be used for the delivery of the content, where the contents of any broadcast representation shall be delivered over only one FLUTE session. Unicast fallback shall be supported.

Bearer Profile 415

The bearer 415 profile defines a bare minimum user service that allows for usage of an MBMS bearer service with minimal data and control plane components, thus giving more flexibility to the application that uses the MBMS delivery. The bearer 415 profile enables the UE to receive UDP datagrams sent to a given multicast address and without introducing any additional processing delays at the MBMS middleware.

The service announcement in the bearer profile is constrained as follows:

The service announcement consists of two metadata fragments only the USD metadata fragment and an SDP fragment. The SDP fragment shall be referenced by the USD fragment and not embedded. The deliveryMethod element shall only contain the sessionDescriptionURI element.

The service announcement is delivered in one of the following ways: as a response to an MBMS address resolution request. Made directly available to the UE by the sending application through a dedicated interface. The delivery function used by the bearer profile shall provide access to UDP datagrams delivered to a multicast address. The reception of the multicast stream may be triggered through external signaling received by the UE, e.g. using the GC1 interface of the group communication enabler.

No additional transport functionality is provided in this profile for higher flexibility. This profile allows, for instance to realize a group communication service using session initiation protocol (SIP) and (real-time protocol) RTP on top of MBMS. The SDP gives further details on the transport protocol and configuration that are used by the application.

Figure 7:
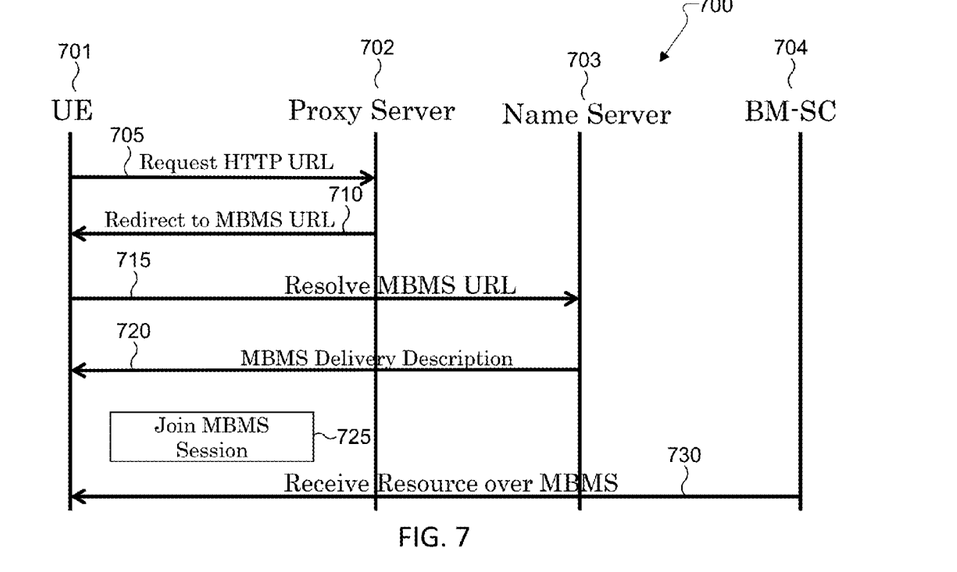
FIG. 7 illustrates another example flow diagram for resolving an MBMS URL according to the various embodiments of the present disclosure.

FIGS. 6 and 7 illustrate example flow diagrams 600 and 700 for resolving an MBMS URL according to the various embodiments of the present disclosure. For example, the process depicted in FIGS. 6 and 7 may be performed by server 200 in FIG. 2 or client device 300 in FIG. 3.

In operation 605, the UE 601 resolves an MBMS URL with the name server 602. The UE 601 requests content from the server. For example, a user selects a video to watch on a client device 300 and the client device 300 transmits a request for the video to a server 200. The server 200 receives the requests and determines a demand for the video. The server 200 determines a high demand for the video when the requests for the video are greater than a threshold and a low demand when the requests for the video are less than the threshold. The threshold can be determined by capacity of the server, a predetermined number of requests, etc. The demand for the video can also be based on historic data of previous videos in a series, with similar creators, etc.

In operation 610, the name server 602 delivers an MBMS description to the UE 601 or redirects the UE 601 to a HTTP URL. When the content is in high demand, the server 200 transmits an MBMS delivery description to the client device 300. When the server 200 determines that there is a low demand for the content, the server 200 redirects the client device 300 with an HTTP URL. The MBMS delivery description includes the information to access the content from a BM-SC, depending on the API. When a file delivery API provides the MBMS delivery description, the receive MBMS delivery description include a broadcast file with a time frame when the file will become available to the UE 601. When a DASH API provides the delivery description, the received MBMS delivery description includes an objectflow object with an initialization segment for the content and a rule for matching the segments of the content. When a socket API provides the MBMS delivery description, the received MBMS delivery description includes a socket object with a session description protocol containing a specific multicast destination. In operation 615, the UE 601 joins the MBMS session.

In operation 620, the UE 601 receives resource over MBMS from the BM-SC 603. The client device 300 receives the resources through the BM-SC from the source. The resources pass-through the BM-SC without the BM-SC generating data.

In operation 705, the UE 701 requests an HTTP URL from the proxy server 702. The client device 300 requests content from the server 200. The server 200 determines whether MBMS is available for the content requested by the client device 300. When the server 200 determines that MBMS is not available, the server 200 transmits a HTTP URL for the client device to receive the content (not illustrated).

In operation 710, the proxy server 702 redirects the UE 701 to an MBMS URL. When the server 200 determines that the MBMS is available, the server 200 redirects the client device 300 to a MBMS URL.

In operation 715, the UE 701 resolves an MBMS URL with the name server 703. The client device 300 transmits the MBMS URL to a server 200. The server 200 determines the MBMS delivery description based on the MBMS URL.

In operation 720, the name server 703 delivers an MBMS description to the UE 701. The server 200 transmits an MBMS delivery description to the client device 300 for receiving the content. The MBMS delivery description includes the information to access the content from a BM-SC, depending on the API. When a file delivery API provides the MBMS delivery description, the receive MBMS delivery description include a broadcast file with a time frame when the file will become available to the UE 601. When a DASH API provides the delivery description, the received MBMS delivery description includes an objectflow object with an initialization segment for the content and a rule for matching the segments of the content. When a socket API provides the MBMS delivery description, the received MBMS delivery description includes a socket object with a session description protocol containing a specific multicast destination. In operation 725, the UE 701 joins the MBMS session.

In operation 730, the UE 701 receives resource over MBMS from the BM-SC 704. The client device 300 receives the resources through the BM-SC from the source. The resources pass-through the BM-SC without the BM-SC generating data.

An MBMS URI scheme is defined in this specification to simplify the access to resources and streams that are delivered over MBMS or that may potentially be made available over MBMS. The UE 601 registers the MBMS middleware as an MBMS protocol handler, in order to receive all resource requests that use the MBMS URI scheme.

"MBMS" URIs have the following ABNF syntax:
scheme="mbms" ":" host[":" port] "/" path
<host> and <port> are specified in RFC3986.

The "MBMS" URI scheme is used to reference a resource or a data stream that may be delivered over MBMS. The MBMS URI shall be resolved by the MBMS protocol handler using the procedure defined in FIGS. 6 and 7. If the resource or stream is not delivered over MBMS, the UE 601 is redirected to the unicast delivery alternative.

The address resolution procedure consists of the following steps:

Launch the MBMS protocol handler with the received MBMS URL. MBMS protocol handler sends a POST request to the pre-configured MBMS Address Resolution Server (ARS) with the MBMS URL as the value of a NVP with the name "URL". The MBMS ARS responds with the MBMS metadata envelope. Alternatively, the MBMS ARS redirects the UE 601 to the unicast location of the requested resource.

If the URL references a single resource, the mapping between the MBMS URL and the FLUTE URL is either implicit (i.e. replacing the MBMS scheme with the http scheme) or it may be explicitly provided as part of the address resolution response. In addition, an indication by the ARS to the client that other related resources will also be available over MBMS may also be included as part of the response. The SDP shall carry the time information for the transmission provided in UTC time. Additionally, a schedule metadata fragment may be provided to specify the delivery time of a particular resource.

The file delivery API defines an API that provides client functionality for requesting and receiving files over MBMS. The API defines a BroadcastFile object that provides functions for requesting a resource, for receiving events about the status of requested files, and for accessing files delivered over MBMS.

The BroadcastFile object provides a method that takes the MBMS URL of the resource. It performs the following operations:

It resolves the MBMS URL and decides if delivery is happening over unicast or over broadcast. If the delivery is done over unicast, the response shall contain a redirection to the unicast address. If the delivery is done over broadcast, the response shall contain an indication of the time frame when the file will become available at the UE 601. If the file is already received, the response shall contain a URL to the local location of the file on the UE 601.

The BroadcastFile defines the following events:

A progress event occurs when the file reception is ongoing. A partial event occurs when the file reception is aborted with partial file content available. The received byte ranges are provided to the application. A received event occurs the requested file is received completely and is ready to be fetched. A purge event occurs when a requested file is scheduled to be removed from the local cache by an indicated time.

The DASH API defines an API that provides client functionality to access content of Representations of a DASH Presentation over MBMS. An ObjectFlow object is defined by the DASH API to retrieve a set of related files. The ObjectFlow provides an initiation method that takes the URL of the initialization segment for the Representation of interest and a rule for matching the segments of that Representation. The rule can either be a RepresentationID, a URL template, or a base URL.

The ObjectFlow defines the following events:

A received event occurs when an object of an object flow has been received. The first object that is received shall be the initiation segment. A partial event occurs when partial object of an object flow has been received. A gone event has occurred when an MBMS reception is not available anymore and unicast reception shall be used instead.

The plain Socket API defines an API that provides client functionality to access a UDP datagram stream delivered over MBMS. A socket object is defined by the socket API to open and receive UDP datagrams sent to a specific multicast destination address. The socket API provides a resolve function that takes as argument the MBMS URL and returns the SDP of the session. The socket API provides a connect function that takes as arguments the multicast destination address and the UDP port. The socket API provides a receive function that is used to receive a UDP datagram payload that was received over MBMS. The packets are forwarded to the application in the same order as they were received. The socket API also defines the following events:

A ready event occurs when the receiver is informed that one or more packets are ready for reception. A gone event occurs when the receiver is informed that the MBMS reception is not available anymore.

Although FIGS. 6 and 7 illustrate examples of flow diagrams 600 and 700 for resolving an MBMS URL, respectively, various changes could be made to FIGS. 6 and 7. For example, while shown as a series of steps, various steps in each figure could overlap, occur in parallel, occur in a different order, or occur multiple times.

Figure 8:
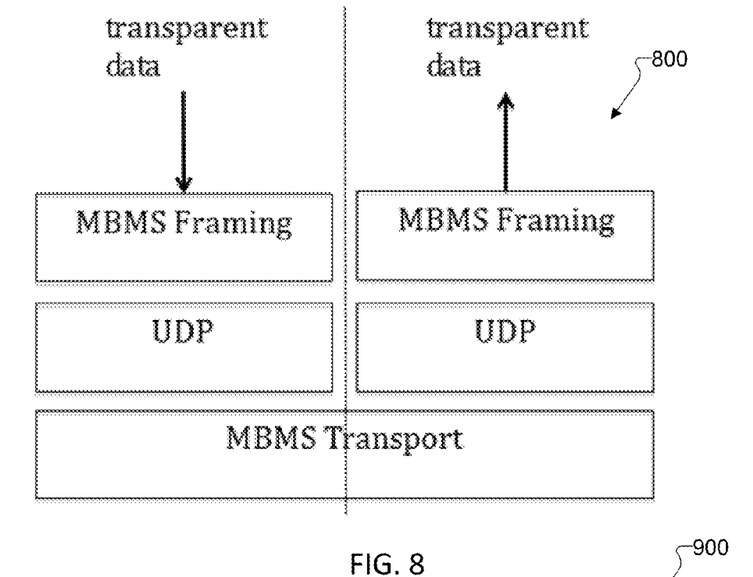
FIG. 8 illustrates an example MBMS framing for a bearer delivery method according to the various embodiments of the present disclosure.
Figure 9:
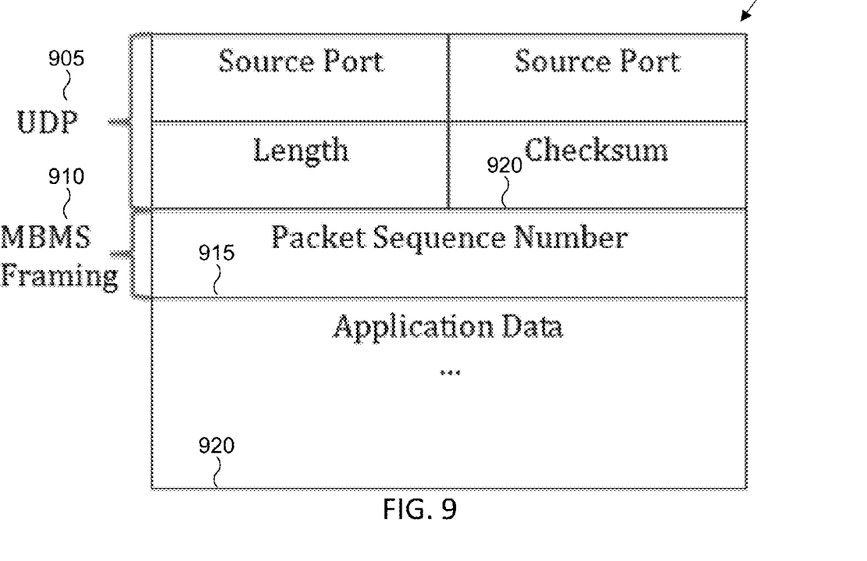
FIG. 9 illustrates an example MBMS framing header according to the various embodiments of the present disclosure.

FIG. 8 illustrates an example MBMS framing for a bearer delivery method 800 according to the various embodiments of the present disclosure. FIG. 9 illustrates an example MBMS framing header 900 according to the various embodiments of the present disclosure. The embodiment of the MBMS framing for a bearer delivery method 800 illustrated in FIG. 8 and the MBMS framing header 900 illustrated in FIG. 9 are for illustration only. FIGS. 8 and 9 do not limit the scope of this disclosure to any particular implementation of an electronic device.

A configurable framing protocol, FEC framework, and buffering model are disclosed to adjust the quality of the transport based on delay and error requirements by the service. An MBMS framing protocol 910 is defined to encapsulate user plane UDP packets 905 to provide MBMS specific functionality. The MBMS framing protocol 910 allows for the addressing of UDP datagrams and the detection of missing packets. If FEC is used, the FEC repair data is delivered over a separate media session.

The source packets are modified to include the packet sequence number 915 immediately after the UDP header. The UDP checksum 920 shall be recalculated after the MBMS framing is performed. The SDP for the bearer delivery method is provided by the content origin at content ingestion and is transparent to the BM-SC 603. The SDP is provided to the MBMS client directly via the application to the UE 601. The SDP contains at least the following SDP parameters: the destination IP address and port number, the protocol ID for each media session, the temporary mobile group identity (TMGI) of the MBMS Bearer, the maximum delay tolerance attribute, and the requested QoE reporting as defined in section 8.3.2.1 as a media level attribute.

The "max-allowed-delay" is a media level SDP attribute that informs the receiver about the maximum allowed delay from the time of reception of the UDP datagram to the time of passing it to the receiving application. This time sets an upper boundary on time consumed for any operations such as FEC decoding. This value is indicated in milliseconds.

The identification of the MBMS framing protocol is provided as part of the protocol ID. For example, it could be UDP/MBMS/RTP for RTP traffic that is carried over the MBMS framing protocol and UDP.

In certain embodiments of the present disclosure, MBMS framing may be done by encapsulating UDP datagrams in MBMS/UDP/IP packets. In certain embodiments of the present disclosure, information about the measured quality of service (QoS) is reported back to the server.

The metric "UDP Datagram Loss" indicates the number of consecutive UDP datagram losses that are detected through a gap in MBMS framing packet sequence number. This metric is only applicable to the bearer delivery method.

Another metric "UDP_Datagram Jitter" provides the measured delay jitter that has been measured for example as the deviation from the average transmission delay. In order to get this measurement, the framing protocol must have a delivery timestamp that is set by the BM-SC when transmitting a UDP datagram.

Although the present disclosure has been described with an exemplary embodiment, various changes and modifications may be suggested to one skilled in the art. It is intended that the present disclosure encompass such changes and modifications as fall within the scope of the appended claims.

None of the description in this application should be read as implying that any particular element, step, or function is an essential element that must be included in the claim scope. The scope of patented subject matter is defined only by the claims. Moreover, none of the claims is intended to invoke 35 U.S.C. § 112(f) unless the exact words "means for" are followed by a participle.

What is claimed is:

1. A client device comprising:
a memory; and
one or more processors operably coupled to the memory, the one or more processors configured to:
receive, for an MBMS session, encapsulated user datagram protocol (UDP) packets that are encapsulated according to an MBMS framing protocol;
identify a maximum allowed delay for the MBMS session;
perform forward error coding correction (FEC) decoding on the encapsulated packets according to the maximum allowed delay; and
report information about a measured Quality of Service (QoS) for the MBMS session,
wherein the information comprises a UDP datagram loss metric indicating a number of consecutive UDP datagram losses detected based on a gap in a packet sequence number.

2. The client device of claim 1, wherein the UDP packets are encapsulated according to an MBMS framing protocol based on modification of a header of UDP packets to include the packet sequence number for the MBMS session and a checksum calculated based on the modified header.

3. The client device of claim 1, wherein:
the one or more processors are configured to report information about a measured Quality of Service (QoS) for the MBMS session, and
the information comprises a UDP datagram jitter metric that indicates a measured delay jitter as a deviation from average transmission delay.

4. The client device of claim 1, wherein the maximum allowed delay for the MBMS session is identified based on a maximum delay tolerance attribute included in a session description protocol (SDP) delivery description that is received separately from the MBMS session.

5. The client device of claim 1, wherein the encapsulated packets are FEC encoded based on the maximum allowed delay.

6. A method for multimedia broadcast/multicast service (MBMS), the method comprising:
receiving a flow of user datagram protocol (UDP) packets for an MBMS session;
encapsulating the UDP packets according to an MBMS framing protocol;
identifying a maximum allowed delay for the MBMS session;
performing forward error coding correction (FEC) encoding according to the maximum allowed delay;
sending the encapsulated packets for the MBMS session to a client device; and
receiving information about a measured Quality of Service (QoS) for the MBMS session,
wherein the information comprises a UDP datagram loss metric indicating a number of consecutive UDP datagram losses detected based on a gap in a packet sequence number.

7. The method of claim 6, wherein encapsulating the UDP packets according to an MBMS framing protocol comprises:
modifying a header of UDP packets to include the packet sequence number for the MBMS session; and
calculating a checksum based on the modified header.

8. The method of claim 6, further comprising:
receiving information about a measured Quality of Service (QoS) for the MBMS session,
wherein the information comprises a UDP datagram jitter metric that indicates a measured delay jitter as a deviation from average transmission delay.

9. The method of claim 6, wherein receiving the maximum allowed delay for the MBMS session is identified based on a maximum delay tolerance attribute included in a session description protocol (SDP) delivery description that is sent to the client device separately from the MBMS session.

10. The method of claim 9, wherein:
the SDP delivery description further includes a protocol identifier for the MBMS session,
the maximum delay tolerance attribute indicates the maximum allowed delay from of reception of a UDP datagram to passing the UDP datagram an application layer, and
the protocol identifier for the MBMS session indicates that the MBMS framing protocol is used for the MBMS session.

11. The method of claim 6, wherein the FEC encoding is configured based on the maximum allowed delay.

12. A server comprising:
a memory; and
one or more processors operably coupled to the memory, the one or more processors configured to:
receive a flow of user datagram protocol (UDP) packets for an MBMS session;
encapsulate the UDP packets according to an MBMS framing protocol;
identify a maximum allowed delay for the MBMS session;
perform forward error coding correction (FEC) encoding according to the maximum allowed delay;
transmit the encapsulated packets for the MBMS session to a client device; and
receive information about a measured Quality of Service (QoS) for the MBMS session,
wherein the information comprises a UDP datagram loss metric indicating a number of consecutive UDP datagram losses detected based on a gap in a packet sequence number.

13. The server of claim 12, wherein the one or more processors are configured to:
modify a header of UDP packets to include the packet sequence number for the MBMS session; and
calculate a checksum based on the modified header.

14. The server of claim 12, wherein the one or more processors are further configured to receive information about a measured Quality of Service (QoS) for the MBMS session,
wherein the information comprises a UDP datagram jitter metric that indicates a measured delay jitter as a deviation from average transmission delay.

15. The server of claim 12, wherein the maximum allowed delay for the MBMS session is identified based on a maximum delay tolerance attribute included in a session description protocol (SDP) delivery description that is sent to the client device separately from the MBMS session.

16. The server of claim 15, wherein:
the SDP delivery description further includes a protocol identifier for the MBMS session,
the maximum delay tolerance attribute indicates the maximum allowed delay from of reception of a UDP datagram to passing the UDP datagram an application layer, and
the protocol identifier for the MBMS session indicates that the MBMS framing protocol is used for the MBMS session.

17. The server of claim 12, wherein the FEC encoding is configured based on the maximum allowed delay.

\* \* \* \* \*